US010937961B2

(12) United States Patent
Ok et al.

(10) Patent No.: US 10,937,961 B2
(45) Date of Patent: Mar. 2, 2021

(54) STRUCTURE AND METHOD TO FORM BI-LAYER COMPOSITE PHASE-CHANGE-MEMORY CELL

(71) Applicant: International Business Machines Corporation, Armonk, NY (US)

(72) Inventors: Injo Ok, Loudonville, NY (US); Myung-Hee Na, Lagrangeville, NY (US); Nicole Saulnier, Slingerlands, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/182,293

(22) Filed: Nov. 6, 2018

(65) Prior Publication Data
US 2020/0144501 A1 May 7, 2020

(51) Int. Cl.
*H01L 45/00* (2006.01)
*H01L 27/24* (2006.01)

(52) U.S. Cl.
CPC ...... *H01L 45/1683* (2013.01); *H01L 27/2463* (2013.01); *H01L 45/06* (2013.01); *H01L 45/1233* (2013.01); *H01L 45/1253* (2013.01); *H01L 45/144* (2013.01)

(58) Field of Classification Search
CPC ..... H01L 45/1683; H01L 45/06; H01L 45/12; H01L 45/123; H01L 45/1233; H01L 45/125; H01L 45/1253; H01L 45/14; H01L 45/144; H01L 45/16; H01L 45/168; H01L 27/24; H01L 27/246; H01L 27/2463

USPC .......................................................... 257/4
See application file for complete search history.

(56) References Cited

U.S. PATENT DOCUMENTS

| | | | |
|---|---|---|---|
| 5,825,046 | A | 10/1998 | Czubatyj et al. |
| 7,324,365 | B2 | 1/2008 | Gruening-Von Schwerin et al. |
| 7,422,926 | B2 | 9/2008 | Pellizzer et al. |
| 7,807,497 | B2 | 10/2010 | Lee et al. |
| 7,892,936 | B1 | 2/2011 | Wu et al. |
| 7,935,567 | B2 | 5/2011 | Sandoval |

(Continued)

FOREIGN PATENT DOCUMENTS

CN 102479922 A 5/2012

OTHER PUBLICATIONS

Lai et al., "A Scalable Volume-Confined Phase Change Memory Using Physical Vapor Deposition," Symposium on VLSI Technology, Jun. 11-13, 2013, Kyoto, Japan, pp. T132-T133.

(Continued)

*Primary Examiner* — Monica D Harrison
(74) *Attorney, Agent, or Firm* — Yee & Associates, P.C.

(57) ABSTRACT

A Phase-change-memory (PCM) cell and method of forming the PCM are provided. In an illustrative embodiment, a method of forming a PCM cell includes forming a first layer of a first germanium-antimony-tellurium (GST) type material over at least a portion of the bottom and sides of a pore through a dielectric layer of low dielectric material to a bottom electrode. The method also includes forming a second layer of a second GST type material over the first GST type material along the bottom and sides of the pore over the bottom electrode. The first GST type material is different from the second GST type material.

23 Claims, 11 Drawing Sheets

(56) References Cited

U.S. PATENT DOCUMENTS

| | | | | |
|---|---|---|---|---|
| 7,943,420 | B1* | 5/2011 | Breitwisch | H01L 27/2436 257/E21.067 |
| 8,097,873 | B2 | 1/2012 | Muralidhar et al. | |
| 8,148,197 | B2* | 4/2012 | Marsh | H01L 45/1616 438/102 |
| 9,111,609 | B2 | 8/2015 | Happ et al. | |
| 9,385,310 | B2 | 7/2016 | Zheng | |
| 2007/0012956 | A1* | 1/2007 | Gutsche | B82Y 10/00 257/246 |
| 2008/0017841 | A1* | 1/2008 | Lee | C23C 16/305 257/2 |
| 2008/0054244 | A1 | 3/2008 | Lee et al. | |
| 2010/0054029 | A1* | 3/2010 | Happ | G11C 13/0004 365/163 |
| 2010/0203709 | A1* | 8/2010 | Czubatyj | C23C 14/046 438/478 |
| 2011/0074539 | A1* | 3/2011 | Tsuji | H01L 45/1246 338/20 |
| 2011/0155993 | A1 | 6/2011 | Chen | |
| 2011/0180905 | A1 | 7/2011 | Zheng et al. | |
| 2012/0235110 | A1* | 9/2012 | Sutou | G11B 7/2433 257/4 |
| 2014/0304475 | A1* | 10/2014 | Ramanujan | G06F 12/0895 711/128 |

OTHER PUBLICATIONS

Raoux et al., "Phase-Change Random Access Memory: A Scalable Technology," IBM Journal of Research and Development, vol. 52, No. 4/5, Jul./Sep. 2008, pp. 465-479.

Kim et al., "A Phase Change Memory Cell with Metallic Surfactant Layer as a Resistance Drift Stabilizer," IEEE International Electron Devices Meeting, Dec. 9-11, 2013, Washington, DC, pp. 30.7.1-30.7.04.

Brightsky et al., "Crystalline-as-Deposited ALD Phase Change Material Confined PCM Cell for High Density Storage Class Memory," IEEE International Electron Devices Meeting (IEDM), 2015, pp. 3.6.1-3.6.4.

Happ et al., "Novel One-Mask Self-Heating Pillar Phase Change Memory," Symposium on VLSI Technology, Digest of Technical Papers, Honolulu, HI, Jun. 13-15, 2006, pp. 120-121.

Raoux et al., "Phase Change Materials and Phase Change Memory," MRS Bulletin (New Materials for Post-Si Computing), Aug. 2014, vol. 39, Issue 8, Aug. 2014, pp. 703-710.

Lai, "Current Status of the Phase Change Memory and Its Future," IEEE International Electron Devices Meeting, Dec. 8-10, 2003, Washington, DC, pp. 10.1.1-10.1.4.

Atwood et al., "Current Status of Chalcogenide Phase Change Memory," 63rd Device Research Conference Digest, Jun. 20-22, 2005, Santa Barbara, CA, pp. 29-33.

* cited by examiner

STRUCTURE AND METHOD TO FORM BI-LAYER COMPOSITE PHASE-CHANGE-MEMORY CELL

BACKGROUND

The disclosure relates generally to semiconductor devices and more specifically to phase-change memory cells.

Phase-change-memory (PCM) is a type of non-volatile random-access memory. PCMs exploit the unique behavior of chalcogenide glass. One type of PCM utilizes germanium-antimony-tellurium (GST) materials. As the number of components on an integrated circuit (IC) has grown, the space allocated to individual components has shrunk. Thus, currently, many PCM cells have a small pore with a high aspect ratio in which to fill with GST materials. However, the high aspect ratio makes it difficult to fill GST material into the small pore. Furthermore, low vacuum GST deposition has a low throughput. Consequently, many PCM cells contain significant voids that are not filled with GST material. A large void may cause the PCM to fail. Additionally, because GST is formed as a crystalline structure, chemical mechanical polishing of the surface to remove excess GST material can cause removal of some of the GST from the pore.

Therefore, it would be desirable to have a method and apparatus that take into account at least some of the issues discussed above, as well as other possible issues. For example, it would be desirable to have a method and apparatus that overcome a technical problem with forming GST inside the pore such that presence of voids is reduced or eliminated.

SUMMARY

According to one embodiment of the present invention, a method of forming a PCM cell includes forming a first layer of a first germanium-antimony-tellurium (GST) type material over at least a portion of the bottom and sides of a pore through a dielectric layer of low dielectric material to a bottom electrode. The method also includes forming a second layer of a second GST type material over the first GST type material along the bottom and sides of the pore over the bottom electrode. The first GST type material is different from the second GST type material.

According to another embodiment of the present invention, a phase-change-memory (PCM) cell includes a bottom electrode and at least one first layer over a bottom and at least portions of sides of a via situated above the bottom electrode. The first layer includes a first germanium-antimony-tellurium (GST) type material formed over the bottom electrode. The PCM cell also includes at least one second layer over the first layer. The second layer includes a second GST type material. The second GST type material is different from the first GST type material. The PCM cell also includes a dielectric fill within the sides of the via and a top electrode positioned over the first layer, second layer, and dielectric fill.

According to another embodiment of the present invention, an integrated circuit includes a plurality of logic components and a plurality of memory components. Each of the memory components includes a phase-change-memory (PCM) cell. The PCM cell includes a bottom electrode and at least one first layer over a bottom and at least portions of sides of a via situated above the bottom electrode. The first layer includes a first germanium-antimony-tellurium (GST) type material formed over the bottom electrode. The PCM cell also includes at least one second layer over the first layer. The second layer includes a second GST type material. The second GST type material is different from the first GST type material. The PCM cell also includes a dielectric fill within the sides of the via and a top electrode positioned over the first layer, second layer, and dielectric fill.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, region, or substrate is referred to as being "on" or "over" another element, the element can be directly on the other element or intervening elements can also be present. In contrast, when an element is referred to as being "directly on," "directly over," or "on and in direct contact with" another element, there are no intervening elements present, and the element is in contact with another element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross sections of a portion of an integrated circuit during fabrication and are not drawn to scale, but instead are drawn so as to illustrate different illustrative features of the disclosure.

Figure 1:
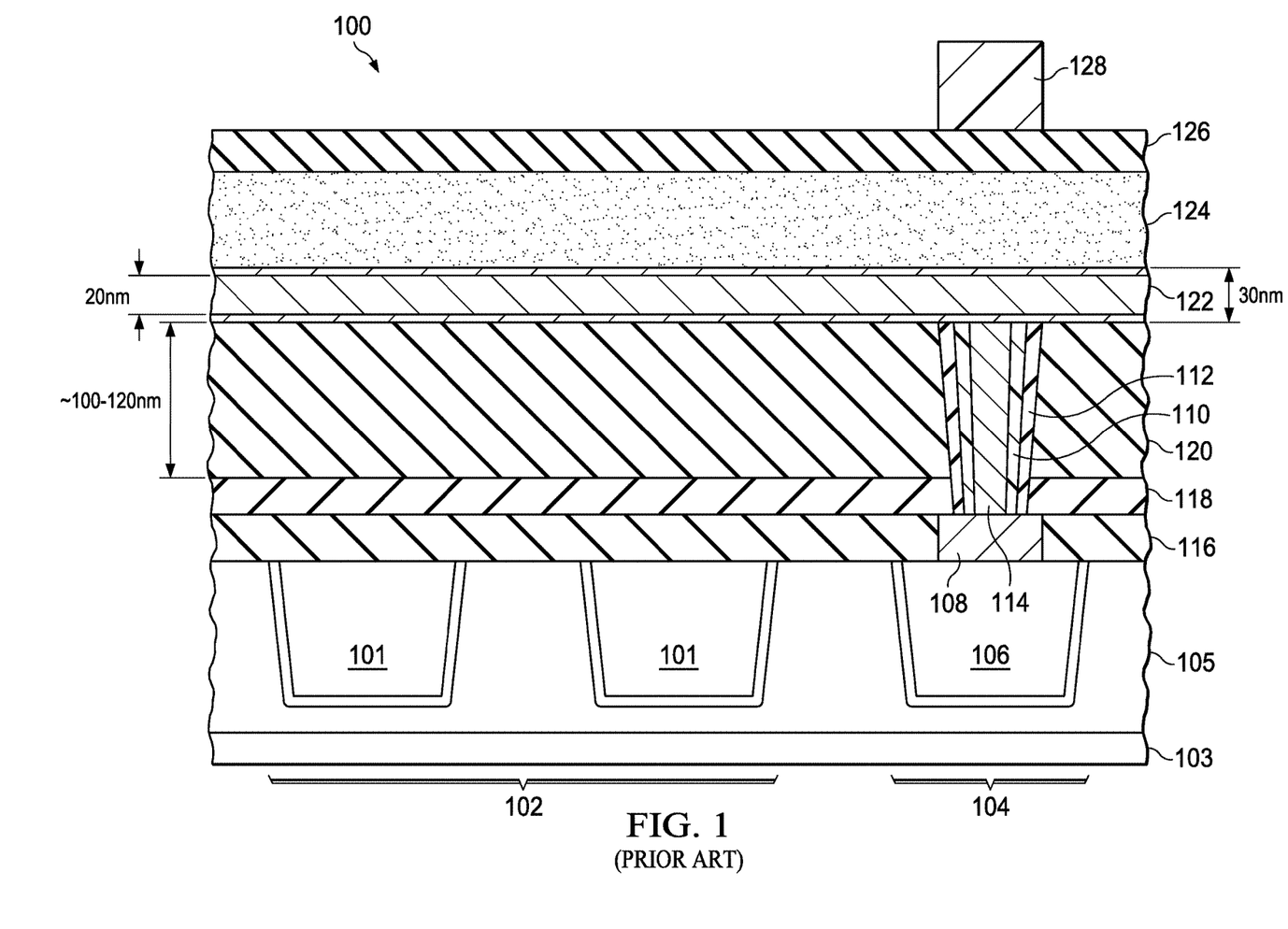
FIG. 1 is a cross-sectional diagram of a prior art semiconductor device.

With reference now to the figures and, in particular, with reference to FIG. 1, a cross-sectional diagram of a prior art semiconductor device 100 with a PCM area 104. The device 100 includes a POR area 102 for logic devices. The POR area 102 includes landing pads F2 101 for the logic devices. The PCM area includes a landing pad 106. The landing pads 101, 106 are typically tungsten (W) or copper (Cu). The device 100 includes a substrate 103 covered by a silicon layer 105 in which the landing pads 101, 106 are embedded. The device 100 also includes a silicon mononitride (SiN) layer 116, a low dielectric constant material (low-k or Tetraethyl orthosilicate also known as tetraethoxysilane (Si(OC$_2$H$_5$)$_4$ or (TEOS))) layer 120, a metal layer 122, and other layers 124, 126, with R2 128 formed over the top. A pore lined with a metal 110 and filled with a GST type material 114 and separated from the TEOS layer 120 by a barrier layer 112 forms a connection between a bottom electrode 108 of the PCM and the metal layer 122 that acts as the top electrode.

Because of the high aspect ratio of the pore, it is difficult to fill GST in the small pore. Furthermore, low vacuum GST deposition has a low throughput. This difficulty results in voids in the pores where GST type material is absent. Additionally, because GST type material is crystalline, it is difficult to remove the GST type material from the surface and planarize the surface, since removing GST from the surface may also pull GST type material out of the pore.

Figure 2:
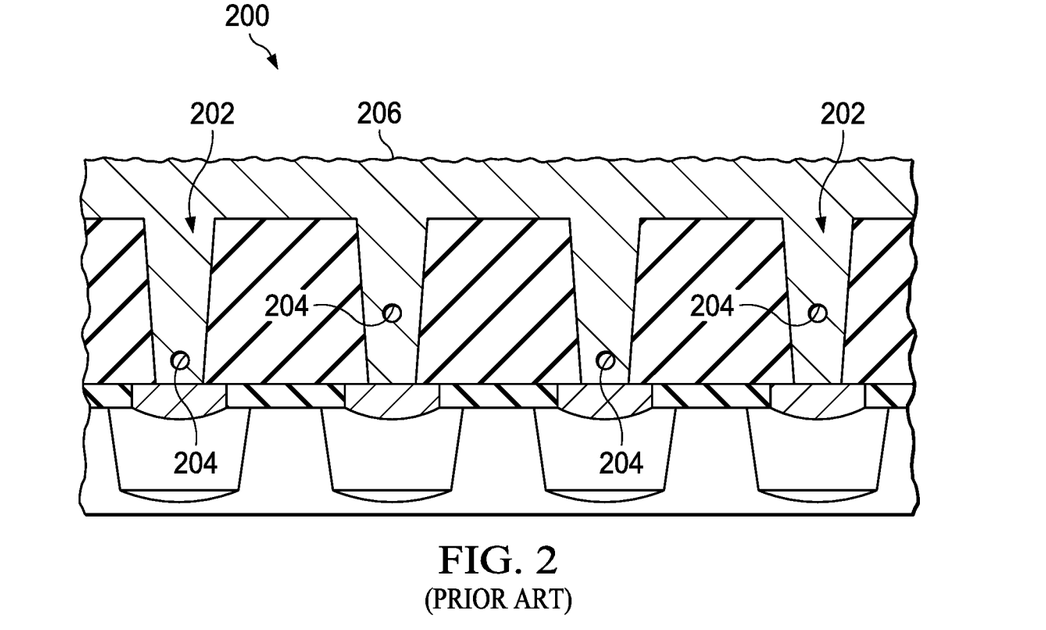
FIG. 2 is a diagram of a prior art semiconductor device with multiple PCMs each having a respective pore filled with GST type material and having voids in the pore and GST type material residing on the top of the device.

FIG. 2 is a diagram of a prior art semiconductor device 200 with multiple PCMs each having a respective pore 202 filled with GST type material and having voids 204 in the pore 202 and GST type material 206 residing on the top of the device 200. This GST type material 206 should be removed, but doing so, sometimes removes GST type material from the pore, which is undesirable.

Figure 3:
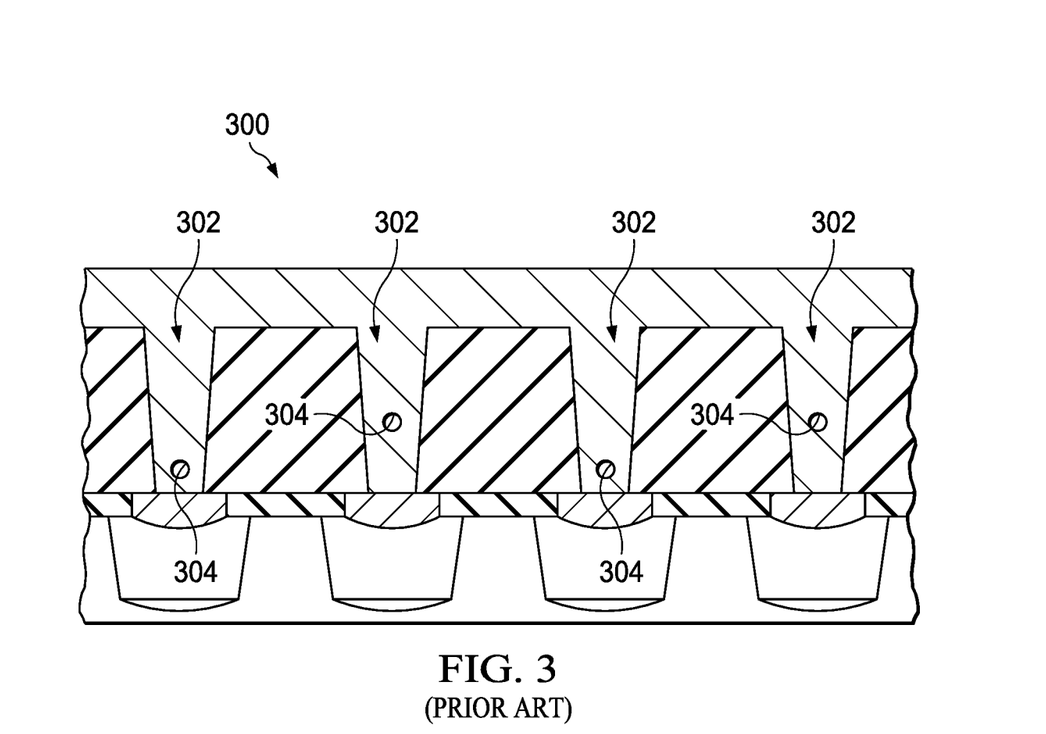
FIG. 3 is a diagram of a prior art semiconductor device with multiple PCMs each having a respective pore, some of which contain voids in the GST type material.

FIG. 3 is a diagram of a prior art semiconductor device 300 with multiple PCMs each having a respective pore 302, some of which contain voids 304 in the GST type material. A large enough void 304 can cause the PCM to function poorly or to not function at all.

The disclosed processes provide methods to produce PCM with GST type materials that are less likely to have pores and or extraneous GST type material residing on top of the device than are prior art methods.

FIGS. 4-14 are cross-sectional views of a semiconductor device with a PCM at various stages of processing depicted in accordance with illustrative embodiments.

Figure 4:
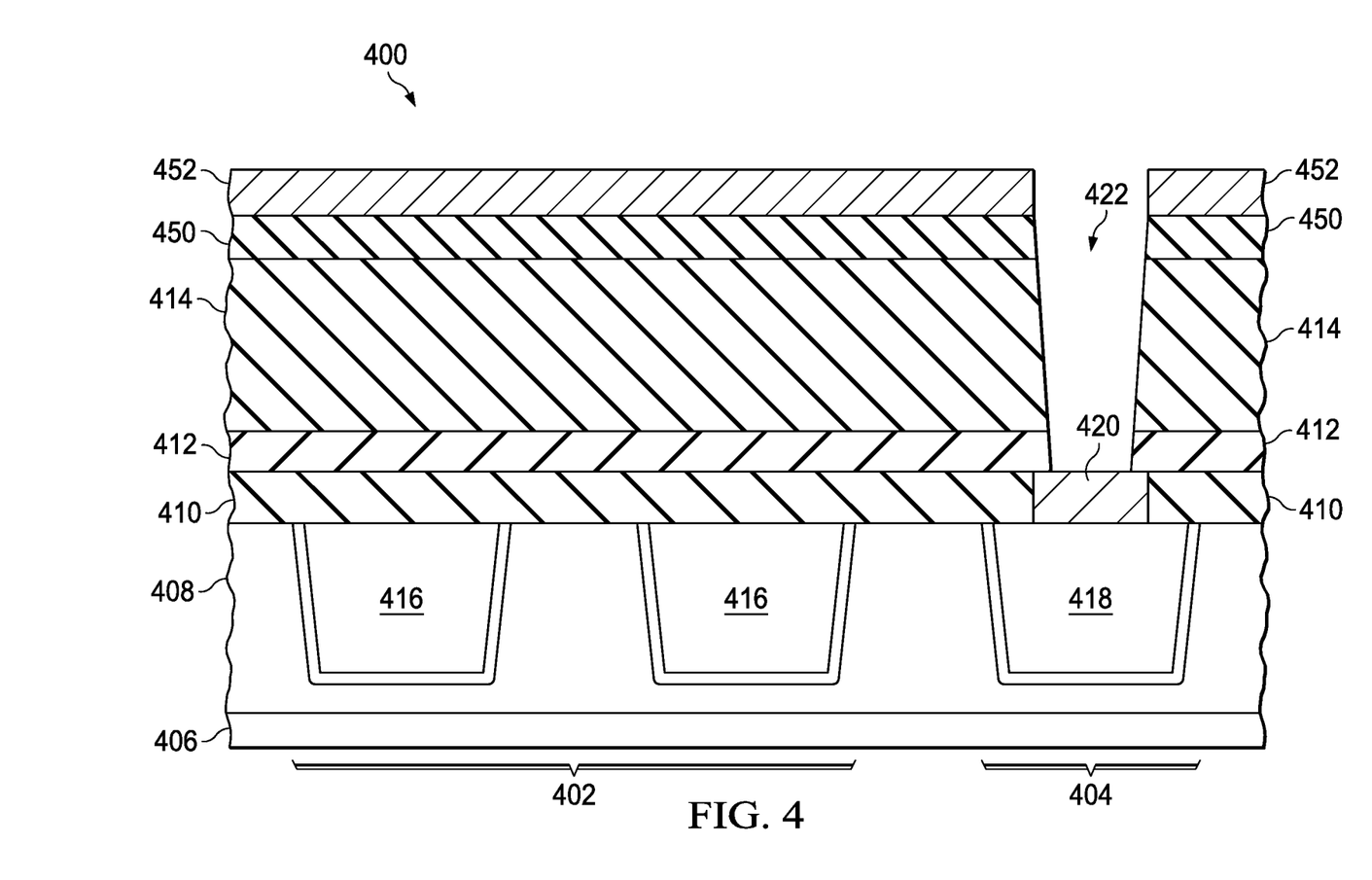
FIGS. 4-14 are cross-sectional views of a semiconductor device with a PCM at various stages of processing depicted in accordance with illustrative embodiments.

FIG. 4 is a cross-sectional diagram of a semiconductor device 400 at an early stage in processing. The resulting device after finishing processing includes a bi-layer composite PCM cell. The device 400 is divided into a logic region 402 and a PCM region 404. The device 400 includes a substrate 406 over which a silicon layer 408 is deposited. Landing pads 416, 418 for the logic region 402 and the PCM region 404 are embedded in the silicon layer 408. The device 400 also includes a 400C Silicon Mononitride (SiN) layer 410, an NBLOK layer 412, a Tetraethyl orthosilicate also known as tetraethoxysilane (Si(OC$_2$H$_5$)$_4$ or (TEOS)) layer 414, a sacrificial layer 450 of SiN for FHMR, and a layer 452 of titanium nitride (TiN) for hard mask patterning. The device 400 also includes a bottom electrode 420 over the PCM landing pad 418 in the PCM area 404. A PCM pore or via 422 is formed through the layers 412, 414, 450, 452 down to the top of the bottom electrode 420. In an embodiment, the width of the pore 422 is about 28 nm. In an embodiment, the pore 422 thickness is between about 30 nm and 100 nm.

In an embodiment, the landing pads 416, 418 are tungsten (W) or copper (Cu). In an embodiment, the bottom electrode 420 is about 20 nm thick and is constructed from tantalum nitride (TaN). In an embodiment, the bottom electrode 420 is about 35 nm thick. In an embodiment, the bottom electrode 420 has a thickness between about 20 nm and about 35 nm. In other embodiments, the bottom electrode 420 is a metal such as, for example, W or Cu. In other embodiments, the bottom electrode 420 may be constructed from any electrical conductive material. In an embodiment, the width of the bottom electrode 420 is between about 36 nanometers (nm) and about 56 nm. In an embodiment, the SiN layer 410 is between about 20 nm thick and about 35 nm thick, the NBLOK layer 412 is about 30 nm thick, the TEOS layer 414 is about 100 nm to about 120 nm thick, the sacrificial layer 450 is about 25 nm thick, and the hard mask layer 452 is about 25 nm thick.

After the pore 422 has been formed, the hard mask layer 452 and the sacrificial layer 450 are removed.

Figure 5:
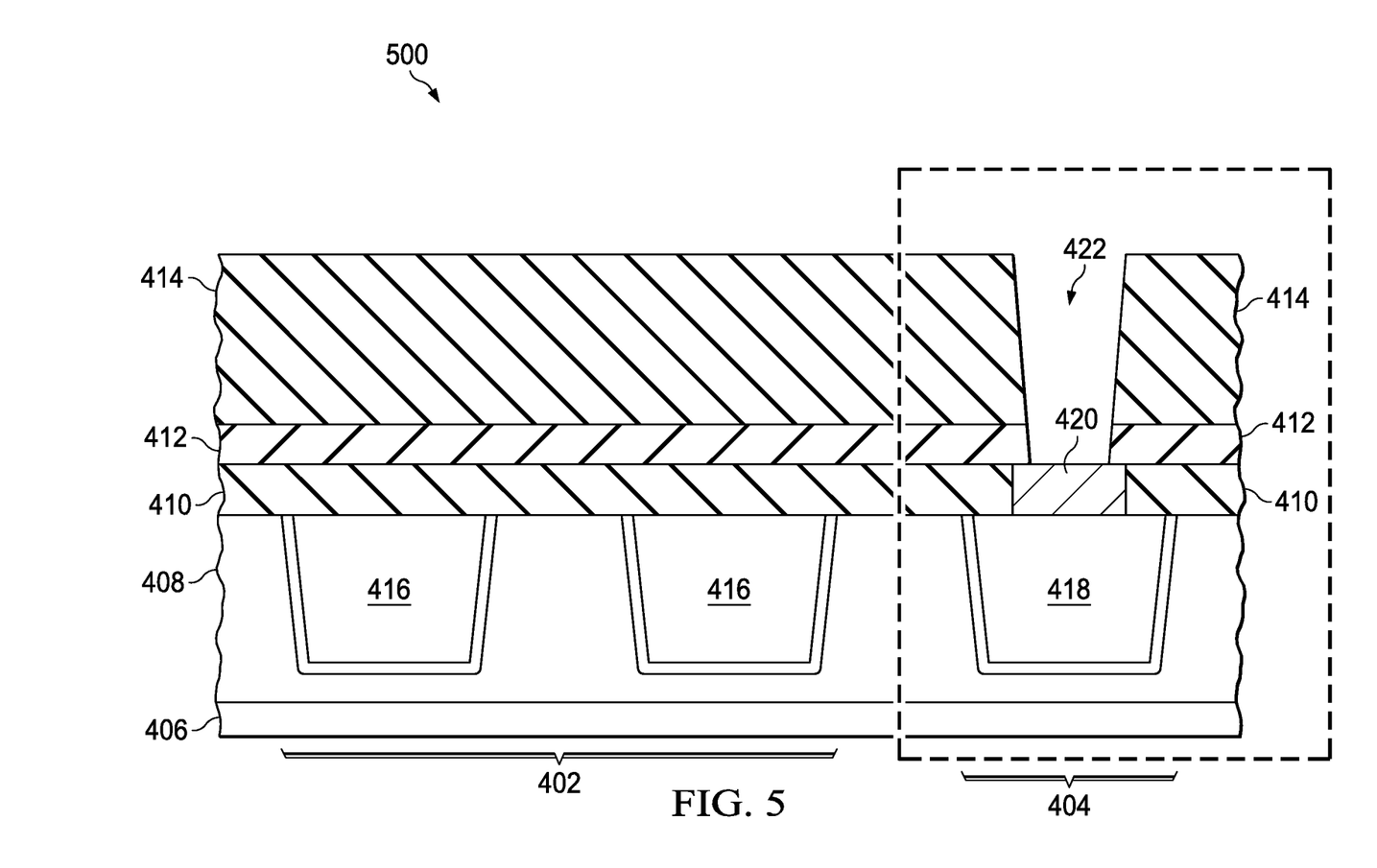
Figure 6:
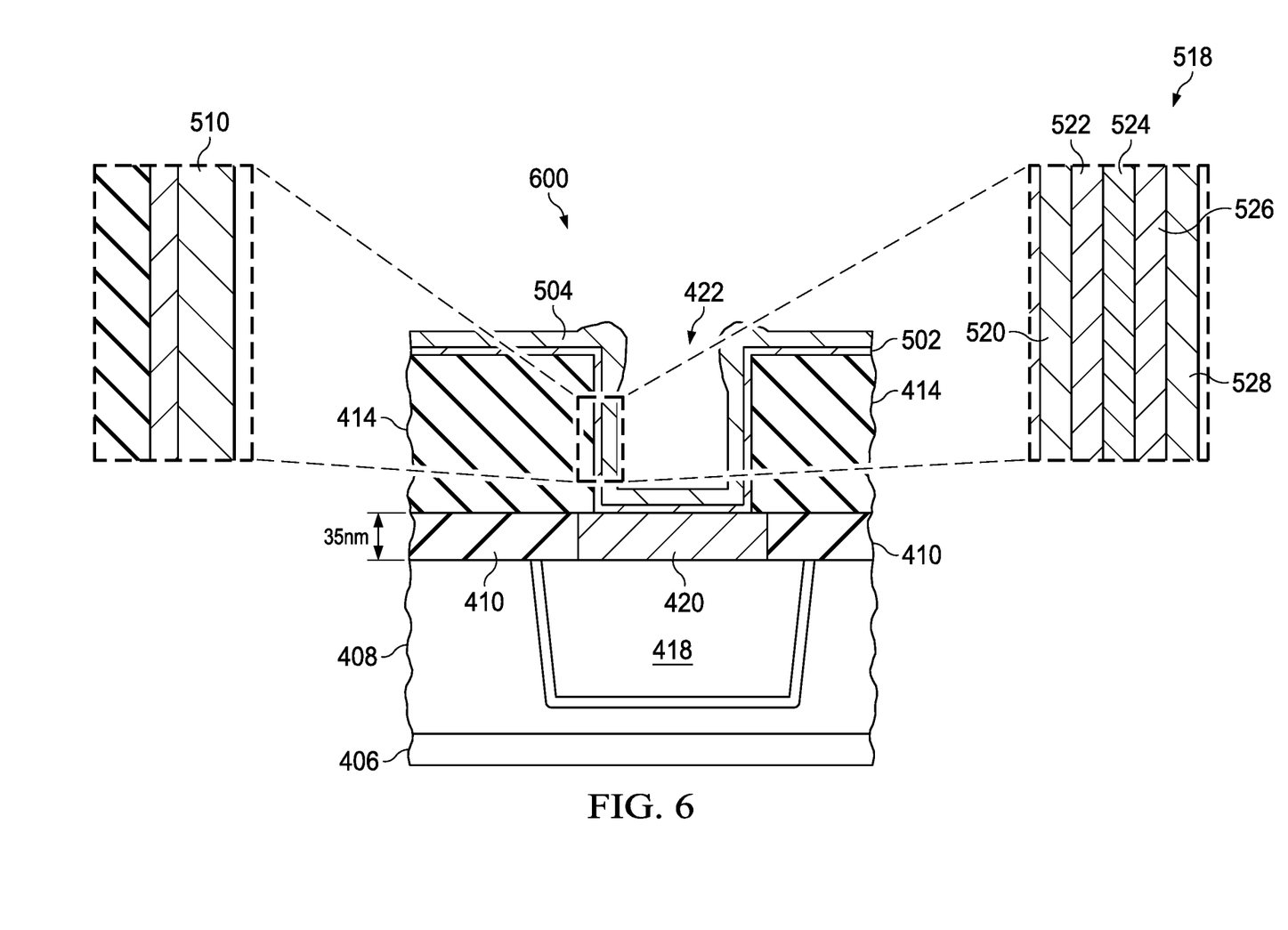

FIG. 5 is a cross-sectional view of a device 500 after removal of the hard mask layer 452 and the sacrificial layer 450 from device 400 in FIG. 4 is depicted in accordance with an illustrative embodiment.

FIG. 6A is a cross-sectional view of a device 600 after depositing a metal liner 502 and a first GST type material layer 504 over the device 500 in FIG. 5 is depicted in accordance with an illustrative embodiment. In an embodiment, the metal layer 502 is a metal nitride liner. In an embodiment, the metal layer 502 is between about 3 nm and 8 nm thick. In an embodiment, the metal layer 502 is constructed from Cu or W. The metal layer 502 may be constructed from any metal. In some embodiments, the metal layer 502 is omitted. In an embodiment, the first GST type material layer 504 is between about 3 nm and about 10 nm thick. The first GST type material layer 504 may be constructed from any type of GST type material. In an embodiment, a GST type material is a material that contains at least one of germanium (Ge), antimony (Sb), and tellurium (Te). Examples of a GST type material include Sb$_2$Te$_3$, GeSb$_4$Te$_7$, GeSb$_2$Te$_4$, Ge$_2$Sb$_2$Te$_5$, GeTe, Ge, Sb, and Te. GST type materials may also include other materials in addition to Ge, Sb, and Te. In an embodiment, a GST type material also includes silicon (Si).

The first GST type material layer 504 may be constructed of a mixture of GST type materials 510 as shown in FIG. 6B or may be a multi-layer GST 518 with separate or multiple layers 520, 522, 524, 526, 528 of multiple or different GST type materials as shown in FIG. 6C. In an embodiment, the separate layers 520, 522, 524, 526, 528 may have a uniform thickness or one or more of the layers 520, 522, 524, 526, 528 may be different from the thickness of one or more of the other layers 520, 522, 524, 526, 528.

Figure 7:
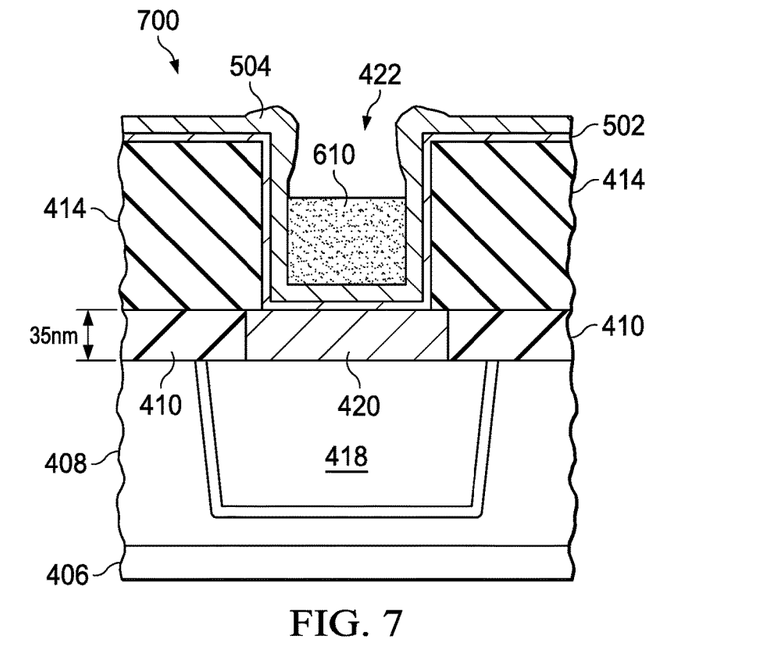

After the metal liner 502 and the first GST type material layer 504 have been deposited, then the pore 422 of device 600 in FIG. 6A is partially filled with an organic planarization layer (OPL) 610 resulting in device 700 depicted in FIG. 7.

Figure 8:
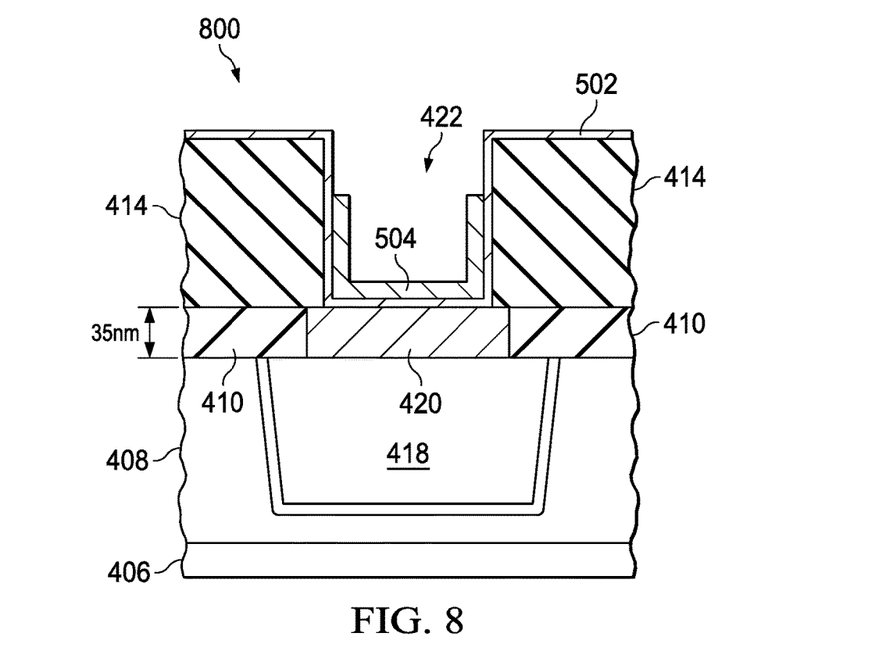
Figure 9:
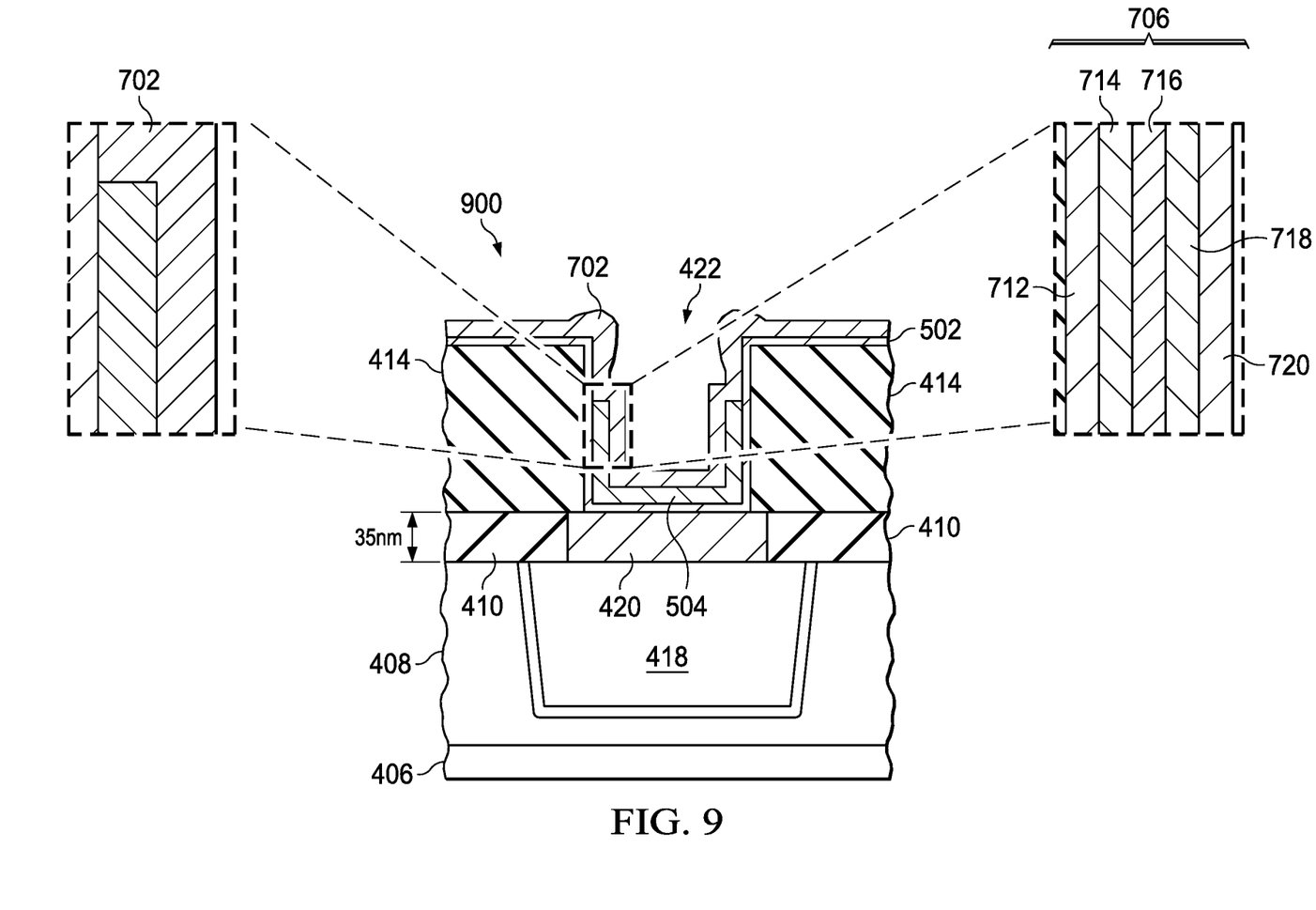

Next, the first GST type material layer 504 above the level of the OPL in device 700 in FIG. 7 is removed resulting in the device 800 depicted in FIG. 8. In an embodiment, the first GST type material layer 504 above the level of the OPL device is removed by etching and/or by chamfering.

After removing part of the first GST type material layer 504, a second GST type material layer 706 is deposited over the top of the device 800 in FIG. 8 resulting in device 900 shown in FIG. 9A. In an embodiment, the second GST type material layer 706 is about 3 nm to about 10 nm thick. In an embodiment, the second GST type material layer 702 is a mixture of GST type materials as shown in FIG. 9B or a multi-layer GST type material 706 including layers 712, 714, 716, 718, 720 of different GST type materials as shown in FIG. 9C. Although shown with five layers 712, 714, 716, 718, 720, the multi-layer GST type material 706 may include more or fewer layers than five. In an embodiment, the thickness of the layers 712, 714, 716, 718, 720 is uniform or the thickness of one or more of the layers 712, 714, 716, 718, 720 is different from the thickness of one or more other layers 712, 714, 716, 718, 720. In an embodiment, the first GST type material layer of different GST type material 504 is constructed from a different GST type material than the second GST type material layer 702. In an embodiment, a different GST type material may include, for example, a first GST type material that is a mixture of GST type materials while the second GST type material is a multi-layer of the same GST type materials that are combined in the mixture of GST type materials. In an embodiment, both the first and second GST type material layers 504, 702 are multi-layer GST type materials, but with different combinations of GST type materials in the layers or different ordering of the same GST type materials in the multiple layers. In an embodiment, both the first and second GST type material layers 504, 702 are mixtures of GST type materials, but the combination of GST type materials in each mixture is different or the ratios of the GST type materials in the combination of GST type materials are different. In an embodiment, the thickness of the second GST type material layer 702 is the same as the thickness of the first GST layer 504. In an embodiment, the thickness of the second GST type material layer 702 is different than the thickness of the first GST layer 504.

Figure 10:
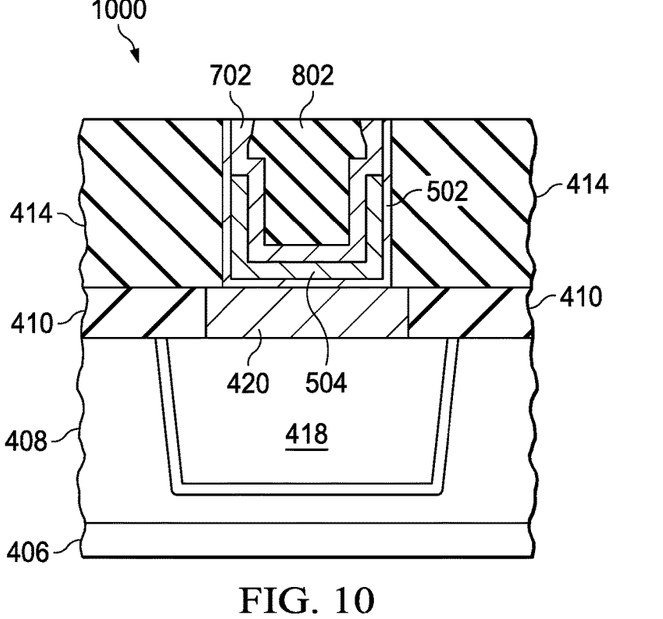

After the second GST type material layer 702 has been deposited on the device 900 shown in FIG. 9A, the remaining portion of or remaining space in the pore 422 is filled with oxide 802 and the top of the device 900 is planarized by, for example, chemical mechanical polishing (CMP) to produce the device 100 shown in FIG. 10.

Figure 11:
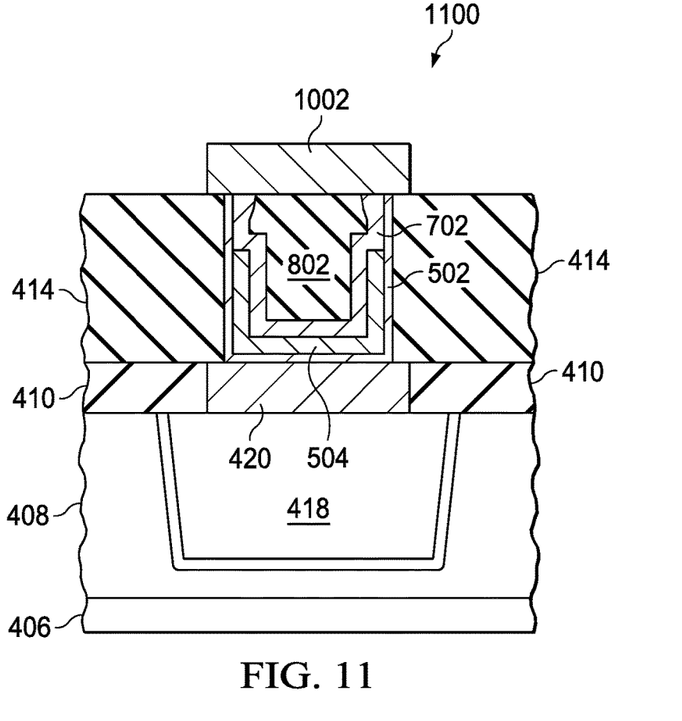

Finally, a top electrode 1002 is formed over the top of the device 1000 in FIG. 10 resulting in the device 1100 shown in FIG. 11.

Figure 12:
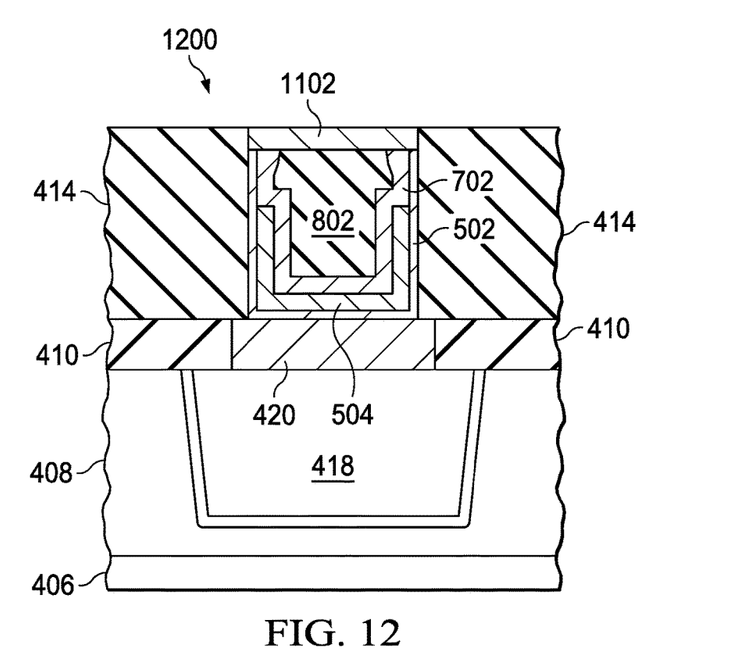

In an embodiment, the top electrode 1102 is formed flush with the top surface of the dielectric layer 414 of the device 1200 as shown in FIG. 12.

Figure 13:
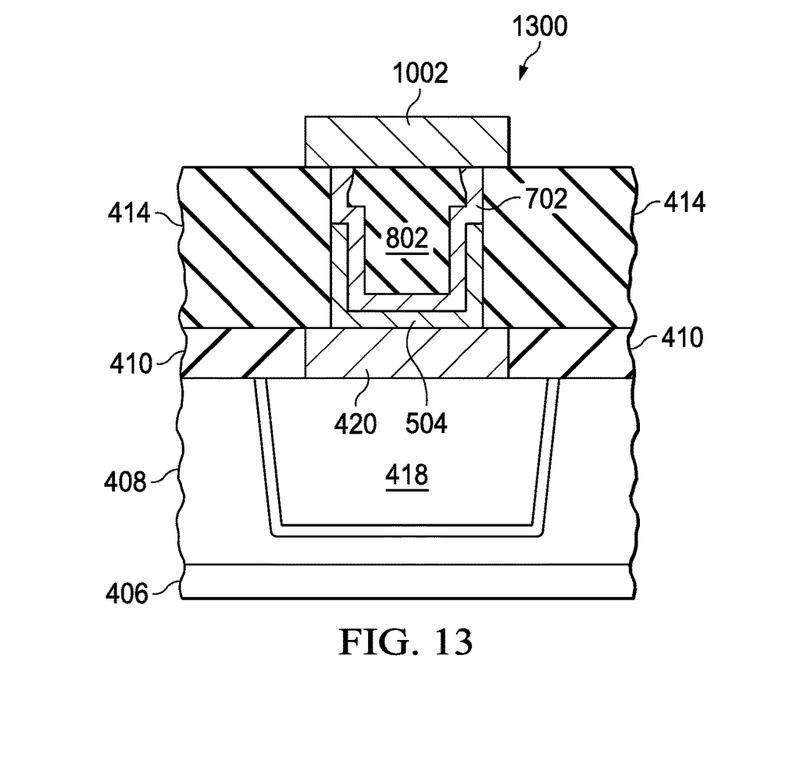

In an embodiment, the top electrode 1002 is formed on the top of the device 1300 but with the metal liner 502 omitted as shown in FIG. 13. Device 1300 is similar to device 1100 except that device 1300 does not have a metal liner.

Figure 14:
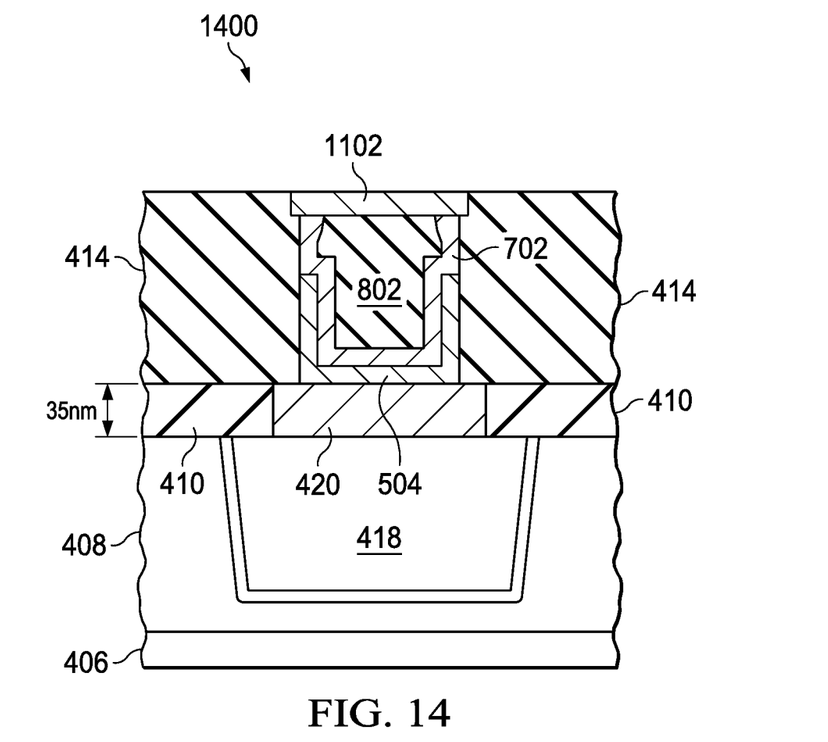

In an embodiment, the top electrode 1102 is formed flush with the top surface of the dielectric layer 414 of the device 1400 but with the metal liner 502 omitted as shown in FIG. 14. Device 1400 is similar to device 1200 except that device 1400 does not have a metal liner.

Figure 15:
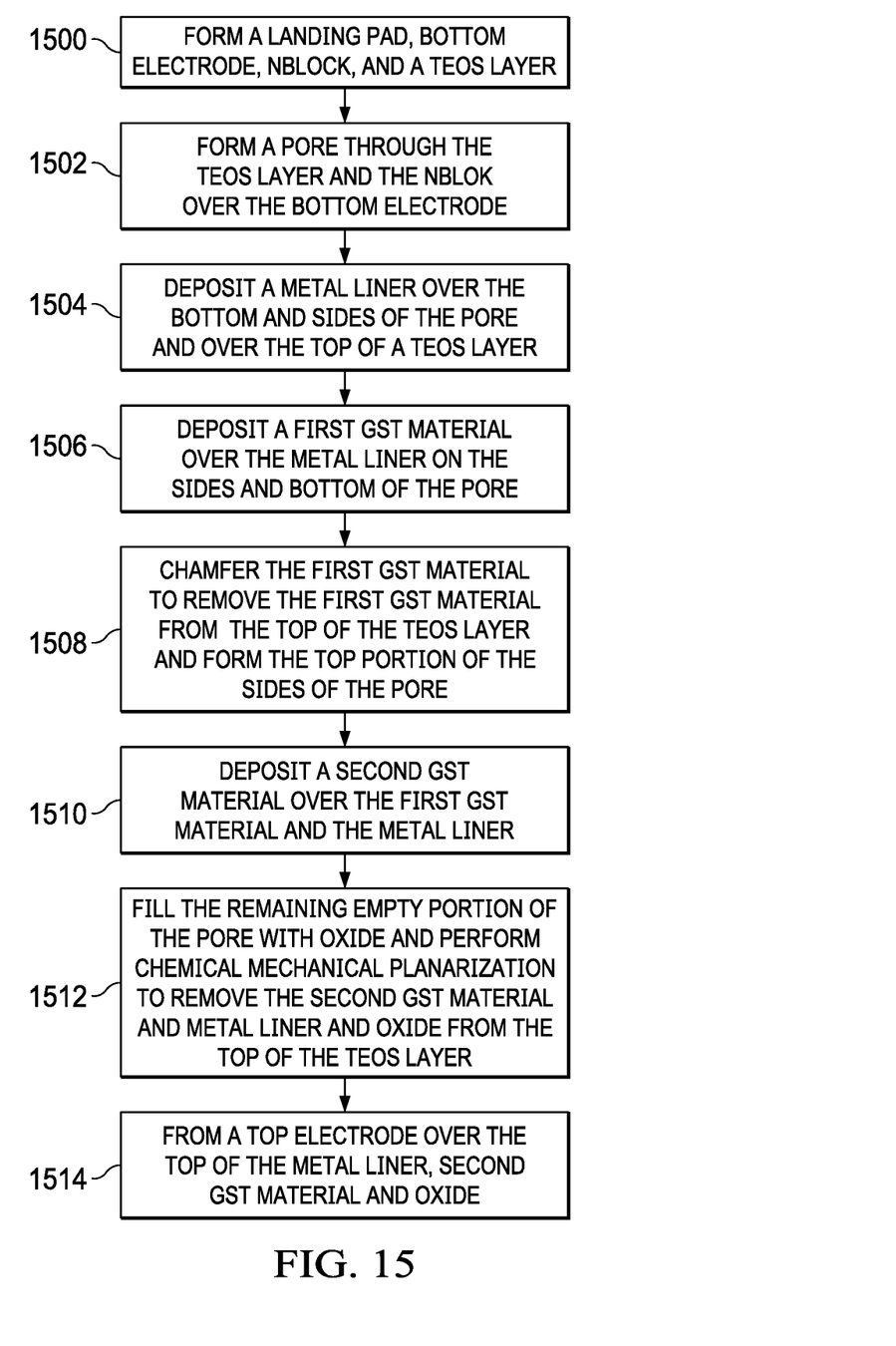
FIG. 15 is a flowchart of a process for fabricating a bi-layer composite PCM cell in accordance with an illustrative embodiment.

Turning next to FIG. 15, a flowchart of a process for fabricating a bi-layer composite PCM cell is depicted in accordance with an illustrative embodiment. The process illustrated in FIG. 15 can be implemented to perform the steps described for fabricating a bi-layer composite PCM cell depicted in FIGS. 4-14.

The process begins by forming a landing pad, bottom electrode, NBLOK layer, and a low-k dielectric layer or TEOS layer on a semiconductor substrate (step 1500). Next, a pore is formed through the low-k dielectric layer or TEOS layer and the NBLOK over the bottom electrode (step 1502). A metal liner is then deposited over the bottom and sides of the pore and over the top of the low-k dielectric layer or TEOS layer (step 1504). A first GST type material is then deposited over the metal liner on the sides and bottom of the pore (step 1506). In an embodiment, the first GST type material is deposited by physical vapor deposition (PVD). Next, the first GST type material is chamfered to remove the first GST type material from the top of the low-k dielectric layer or TEOS layer and from the top portion of the sides of the pore such that the first GST type material covers only a lower portion or bottom portion of the pore (step 1508). A second GST type material is then deposited over the first GST type material and the metal liner (step 1510). In an embodiment, the second GST type material is deposited by PVD. Next, the remaining empty portion of the pore is filled with oxide and chemical mechanical planarization (CMP) is performed to remove the second GST type material, the metal liner, and the oxide from the top of the low-k dielectric layer or TEOS layer (step 1512). A top electrode is then formed over the top of the metal liner, second GST type material, and the oxide (step 1514). The top electrode may set flush with the top of the low-k dielectric layer or TEOS layer or may be formed above the low-k dielectric layer or TEOS layer.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code, hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figure. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, additional steps showing forming the floating channel or other materials for forming metal or dielectric layers may be present although not described in the flowcharts. In yet another illustrative example, one or more additional logic devices may be fabricated along with the PCM cell.

The process utilized to create the structure, results in PCM cell structures with better performance due the fact that fewer GST voids or defects are present in the PCM than occurs in prior art methods. Also, the disclosed processes result in PCM cell structures with little or no GST type material over the top of the cell and outside of the cell without removing GST type material from the cell itself.

The methods and structures that have been described above with reference to figures in the different examples, may be employed in any electrical device including integrated circuit chips. The integrated circuit chips including the disclosed structures and formed using the disclosed methods may be integrated with other chips, discrete circuit elements, and/or other signal processing devices as part of either an intermediate product, such as a motherboard, or an end product. The end product can be any product that includes integrated circuit chips, including computer products or devices having a display, a keyboard or other input device, and a processor unit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method of forming a phase-change-memory (PCM) cell, comprising:
   forming a first layer of a first germanium-antimony-tellurium (GST) type material over a bottom and at least a lower portion of sides of a pore through a dielectric layer of low dielectric material to a bottom electrode;
   forming a second layer of a second GST type material over the first GST type material along the bottom and sides of the pore above the bottom electrode, wherein the first GST type material is different from the second GST type material; and
   filling a remaining space in the pore with an oxide over the second layer.

2. The method of claim 1, wherein the first GST type material comprises one of a first mixture of GST type materials and multiple layers of multiple GST type materials and wherein the second GST type material comprises one of a second mixture of GST type materials and multiple layers of multiple GST type materials.

3. A method of forming a phase-change-memory (PCM) cell, comprising:
   forming a first layer of a first germanium-antimony-tellurium (GST) type material over at least a portion of a bottom and sides of a pore through a dielectric layer of low dielectric material to a bottom electrode;
   forming a second layer of a second GST type material over the first GST type material along the bottom and sides of the pore over the bottom electrode, wherein the first GST type material is different from the second GST type material;
   filling a remaining space in the pore with an oxide; and
   after forming the first layer and before forming the second layer, partially filling the pore with an organic planarization layer.

4. The method of claim 1, forming a top electrode over the first layer of the GST type material and the second layer of the GST type materials.

5. The method of claim 4, wherein forming the top electrode comprises forming the top electrode such that a top of the top electrode is flush with a top surface of the dielectric layer.

6. The method of claim 4, wherein forming the top electrode comprises forming the top electrode such that the top electrode covers a portion of the dielectric layer.

7. The method of claim 1, wherein forming the first layer of the GST type material and forming the second layer of the GST type material comprises physical vapor deposition (PVD) sputtering of a GST type material.

8. The method of claim 1, wherein the first GST type material includes at least one of germanium (Ge), antimony (Sb), tellurium (Te), $Sb_2Te_3$, $GeSb_4Te_7$, $GeSb_2Te_4$, $Ge_2Sb_2Te_5$, and GeTe.

9. The method of claim 1, wherein the second GST type material includes at least one of germanium (Ge), antimony (Sb), tellurium (Te), $Sb_2Te_3$, $GeSb_4Te_7$, $GeSb_2Te_4$, $Ge_2Sb_2Te_5$, and GeTe.

10. The method of claim 1, wherein at least one of the first GST type material and the second GST type material includes silicon.

11. A phase-change-memory (PCM) cell, comprising:
    a bottom electrode,
    at least one first layer over a bottom and at least a lower portion of sides of a via situated above the bottom electrode, the first layer comprising a first germanium-antimony-tellurium (GST) type material formed over the bottom electrode;
    at least one second layer over the first layer along the bottom and sides of the via above the bottom electrode, the second layer comprising a second GST type material, wherein the second GST type material is different from the first GST type material;
    a dielectric fill over the second layer within the sides of the via filling a remaining space in the via; and
    a top electrode positioned over the first layer, the second layer, and the dielectric fill.

12. The PCM cell of claim 11, further comprising a metal nitride liner covering the sides and bottom of the via situated between the first layer of the GST type material and a low dielectric constant material within which the via is formed.

13. The PCM cell of claim 11, wherein the first layer of the GST type material is positioned only over the lower portion of sides of the via.

14. The PCM cell of claim 11, wherein the first GST type material comprises one of a first mixture of GST type materials and multiple layers of multiple GST type materials and wherein the second GST type material comprises one of a second mixture of GST type materials and multiple layers of multiple GST type materials.

15. The PCM cell of claim 11, wherein the first GST type material includes at least one of germanium (Ge), antimony (Sb), tellurium (Te), $Sb_2Te_3$, $GeSb_4Te_7$, $GeSb_2Te_4$, $Ge_2Sb_2Te_5$, and GeTe.

16. The PCM cell of claim 11, wherein the second GST type material includes at least one of germanium (Ge), antimony (Sb), tellurium (Te), $Sb_2Te_3$, $GeSb_4Te_7$, $GeSb_2Te_4$, $Ge_2Sb_2Te_5$, and GeTe.

17. The PCM cell of claim 11, wherein at least one of the first GST type material and the second GST type material includes silicon.

18. An integrated circuit, comprising:
a plurality of logic components; and
a plurality of memory components, each of the memory components comprising a phase-change-memory (PCM) cell, the PCM cell comprising:
a bottom electrode,
at least one first layer over a bottom and at least a lower portion of sides of a via situated above the bottom electrode, the first layer comprising a first germanium-antimony-tellurium (GST) type material formed over the bottom electrode;
at least one second layer over the first layer along the bottom and sides of the via above the bottom electrode, the second layer comprising a second GST type material, wherein the second GST type material is different from the first GST type material;
a dielectric fill over the second layer within the sides of the via filling a remaining space in the via; and
a top electrode positioned over the first layer, the second layer, and the dielectric fill.

19. The integrated circuit of claim 18, wherein the first GST type material comprises one of a first mixture of GST type materials and multiple layers of multiple GST type materials and wherein the second GST type material comprises one of a second mixture of GST type materials and multiple layers of multiple GST type materials.

20. The method of claim 1, further comprising after forming the first layer and before forming the second layer, partially filling the pore with an organic planarization layer.

21. The method of claim 20, further comprising before forming the second layer removing the first GST type material above the lower portion of sides of the via.

22. The integrated circuit of claim 18, wherein the first layer is positioned only over the lower portion of sides of the via.

23. The method of claim 3, further comprising before forming the second layer removing the first GST type material above a level of the organic planarization layer.

* * * * *